(12) United States Patent
Kim et al.

(10) Patent No.: US 10,314,211 B2
(45) Date of Patent: Jun. 4, 2019

(54) ASSEMBLY STRUCTURE FOR MOTOR DRIVE UNIT

(71) Applicant: LSIS CO., LTD., Anyang-si, Gyeonggi-do (KR)

(72) Inventors: Dong-Sik Kim, Anyang-si (KR); Chun-Suk Yang, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 35 days.

(21) Appl. No.: 15/855,662

(22) Filed: Dec. 27, 2017

(65) Prior Publication Data

US 2018/0213686 A1 Jul. 26, 2018

(30) Foreign Application Priority Data

Jan. 23, 2017 (KR) .................. 10-2017-0010511

(51) Int. Cl.
*H05K 7/20* (2006.01)
*H02P 27/06* (2006.01)

(52) U.S. Cl.
CPC ......... *H05K 7/20918* (2013.01); *H02P 27/06* (2013.01); *H05K 7/20163* (2013.01); *H05K 7/20172* (2013.01); *H05K 7/20909* (2013.01)

(58) Field of Classification Search
CPC .................. H05K 7/20218–20381; H05K 7/20409–20418; H05K 7/20009–202; H05K 5/00–069; H05K 7/00–186; H05K 7/1405; H05K 7/1427; H05K 7/2089; H05K 7/20963; H05K 7/20918; H05K 7/20972; H05K 7/20436; H05K 7/20909–20918; H05K 7/20172; H02P 27/06; G06F 1/181–182; G06F 1/18–189; H01L 23/367–3677; H01L 23/473; H01L 23/46–467
See application file for complete search history.

(56) References Cited

U.S. PATENT DOCUMENTS 7,616,442 B1 * 11/2009 Kaveh ............... H05K 7/20918
165/80.3
9,066,454 B2 6/2015 Donth et al.
(Continued)

FOREIGN PATENT DOCUMENTS

JP 2007325383 A 12/2007
JP 2008026421 A 2/2008
(Continued)

OTHER PUBLICATIONS

European Search Report for related European Application No. 17206931.2; report dated Jun. 11, 2018; (7 pages).
(Continued)

*Primary Examiner* — Robert J Hoffberg
*Assistant Examiner* — Razmeen Gafur
(74) *Attorney, Agent, or Firm* — K&L Gates LLP

(57) ABSTRACT

Disclosed herein is an assembly structure for a motor drive unit. An assembly structure for a motor drive unit is disclosed. The assembly structure does not require the time for rotating, laying down, or fastening the components during processes of producing it, so that the time required for production can be shortened. In addition, since no separate fastening part is required, the assembly structure can be simplified and the production costs can be reduced.

8 Claims, 18 Drawing Sheets

(56) References Cited

U.S. PATENT DOCUMENTS

| | | | | |
|---|---|---|---|---|
| 2007/0253159 A1* | 11/2007 | Lin | ……………… | G06F 1/181 361/679.46 |
| 2009/0268406 A1 | 10/2009 | Isomoto | | |
| 2012/0114461 A1 | 5/2012 | Chen | | |
| 2016/0120069 A1* | 4/2016 | Raassina | ………… | H05K 7/20509 361/697 |

FOREIGN PATENT DOCUMENTS

| | | |
|---|---|---|
| JP | 2009027776 A | 2/2009 |
| JP | 2011259556 A | 12/2011 |
| JP | 2014123659 A | 7/2014 |
| JP | 2015146680 A | 8/2015 |
| JP | 2016058553 A | 4/2016 |
| KR | 20140142049 A | 12/2014 |
| WO | 2008/090754 A1 | 7/2008 |

OTHER PUBLICATIONS

Japanese Office Action for related Japanese Application No. 2017-243200; action dated Dec. 4, 2019; (4 pages).

* cited by examiner

ASSEMBLY STRUCTURE FOR MOTOR DRIVE UNIT

CROSS-REFERENCE TO RELATED APPLICATIONS

Pursuant to 35 USC § 119(a), this application claims the benefit of earlier filing date and right of priority to Korean Patent Application No. 10-2017-0010511 filed on Jan. 23, 2017, in the Korean Intellectual Property Office, the disclosure of which is hereby incorporated by reference in its entirety.

BACKGROUND

1. Technical Field

The present disclosure relates to an assembly structure for a motor drive unit.

2. Description of the Related Art

Generally, a motor drive unit such as an inverter or a servo drive is a power conversion device that converts input alternating current (AC) main power into direct current (DC) power, converts the DC power into AC power suitable for a motor, and supplies the suitable AC power to the motor. The motor drive unit reduces power consumption of the motor and enhances energy efficiency by efficiently controlling the motor.

FIG. 1 is a general view of the internal structure of a conventional motor drive unit, FIG. 2 is an assembly view of a conventional middle base, and FIG. 3 is an assembly view of a conventional capacitor printed circuit board (PCB) assembly. FIG. 4 is an assembly view of a conventional power PCB assembly, FIG. 5 is an assembly view of a conventional electromagnetic compatibility (EMC) filter PCB assembly, and FIG. 6 is an assembly view of a conventional under-cover. FIG. 7 is a view of a conventional fan.

In a conventional motor drive unit 100, a middle base 120 is coupled to an upper portion of a heat sink 110 by a hook 170, and a capacitor PCB assembly 130 is fastened to a capacitor PCB assembly 130 by a screw 180.

In addition, a power PCB assembly 140 is coupled to the middle base 120 by a hook 190. Further, a filter PCB assembly 150 is fastened to the middle base 120 and the heat sink 110 by screws 200.

The under-cover 160 is fastened to a lower portion of the heat sink 110 by screws 210. In addition, a fan 220 is connected to a side surface of the heat sink 110 by a fan cover 230.

However, for the conventional assembly structure as described above, since separate fastening parts such as the screws 210 are used to connect the under-cover 160 to the heat sink 110, machining costs of parts increase and quality deterioration is caused by poor assembly in fastening the screws 210. Further, the fastening operation is not performed in a vertical direction. Rather, a product is rotated to perform the fastening operation, which results in an increased assembly process time and an increased standard time (ST).

Further, using a plurality of separate fastening parts such as the screws 180 and 200 in connecting the PCB assemblies increases machining costs of parts. Due to the screw assembly process, the ST is increased and quality is deteriorated.

Further, connecting the fan 220 to the heat sink 110 requires use of a separate coupling part such as the fan cover 230, which results in increased costs of parts and an increased ST.

SUMMARY

It is an object of the present disclosure to provide an assembly structure for a motor drive unit that provides an improved assembly structure of a heat sink, a fan, and a base case to reduce machining costs of parts to reduce production costs and to simplify processes to shorten the assembly time.

It is another object of the present disclosure to provide an assembly structure for a motor drive unit that improves product quality by preventing poor assembly by preventing wrong assembly of a heat sink and a base case.

It is another object of the present disclosure to provide an assembly structure for a motor drive unit that provides an improved assembly structure of a PCB assembly to reduce assembly defects produced in the assembly process to improve product quality and to reduce machining costs of parts to reduce production costs.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, an assembly structure for a motor drive unit for converting an input power into an alternating current (AC) power suitable for driving a motor, including a base case, a heat dissipation fan including a fan and a housing arranged outside the fan to fix the fan, the heat dissipation fan being disposed in an area of an upper portion of the base case, a heat sink including a base and at least one side face portion formed by extending vertically downward from both left and right ends of the base, the heat sink being disposed on one side of the heat dissipation fan on the base case, a middle base disposed on the heat sink, a power printed circuit board (PCB) assembly disposed on the middle base, and a filter PCB assembly disposed over the power PCB assembly, includes at least one hook fixing portion disposed on the base case to correspond to a position of a front face portion of the housing, at least one hook support disposed on the upper surface of the base case to correspond to a position of a rear face portion of the housing, a first guide portion disposed on the upper surface of the base case to correspond to positions of a left side face portion and a right side face portion of the housing, and a hook engagement portion formed on an inner surface of each of the hook fixing portion and the hook support, wherein a hole corresponding to a shape of the hook engagement portion may be formed in areas corresponding to the hook engagement portion on a front surface and rear surface of the housing.

In one embodiment of the present disclosure, the hook engagement portion may include a first upper portion inclined inward from an inner surface of the hook fixing portion or the hook support, and a first lower portion extending from a boundary of the first upper portion in parallel with the inner surface of the hook fixing portion or the hook support.

In one embodiment of the present disclosure, an upper portion of the first guide portion may be provided with a projection protruding to fix the front surface and rear surface of the housing.

In one embodiment of the present disclosure, the assembly structure may further include at least one first hook portion disposed on the upper surface of the base case to correspond to a position of the side face portion of the heat sink, and a second guide portion disposed on the upper surface of the base case along an outer peripheral surface of the heat sink except for an area where the first hook portion is disposed.

In one embodiment of the present disclosure, the first hook portion may include a second upper portion having an inner surface inclined inward, and a second lower portion formed under the second upper portion and arranged in parallel with the heat sink, wherein a first step is formed in an area where the second upper portion meets the second lower portion.

In one embodiment of the present disclosure, the assembly structure may further include at least one second hook portion disposed on a lower surface of the middle base to correspond to a position of the side face portion of the heat sink, and a third guide portion disposed on the lower surface of the middle base along the outer peripheral surface of the heat sink except for an area where the second hook portion is disposed.

In one embodiment of the present disclosure, the second hook portion may include a third upper portion having an inner surface inclined inward, and a third lower portion formed under the third upper portion and arranged in parallel with the heat sink, wherein a second step may be formed in an area where the third upper portion meets the third lower portion.

In one embodiment of the present disclosure, the assembly structure may further include a rib vertically protruding from an area of the base case corresponding to a lower surface of the at least one side face portion of the heat sink, wherein the lower surface of the at least one side face portion is provided with a recess corresponding to the rib.

In one embodiment of the present disclosure, the assembly structure may further include at least one third hook portion formed on a side surface of the middle base and vertically coupled with the power PCB assembly, wherein the third hook portion May include a fourth upper portion having an inner surface extending downward to be inclined inward, and a fourth lower portion vertically arranged at a bottom of the fourth upper portion, wherein a third step may be formed at a boundary between the fourth upper portion and the fourth lower portion, wherein the power PCB assembly may be provided with a first fastening groove corresponding to the third hook portion and an inner side of the first fastening groove is coupled to the third step.

In one embodiment of the present disclosure, the assembly structure may further include at least one boss on an upper surface of the middle base so as to be coupled with the power PCB assembly and the filter PCB assembly, wherein a hole corresponding to the boss may be formed in each of the power PCB assembly and the filter PCB assembly.

In one embodiment of the present disclosure, the assembly structure may further include at least one fourth hook portion formed on a side surface of the middle base and vertically coupled to the filter PCB assembly, wherein the fourth hook portion may include a fifth upper portion having an inner surface extending downward to be inclined inward, and a fifth lower portion vertically arranged at a bottom of the fifth upper portion, wherein a fourth step formed at a boundary between the fifth upper portion and the fifth lower portion, wherein a second coupling groove corresponding to the fourth hook portion is formed on a side portion of the filter PCB assembly and an inner side of the second coupling groove is coupled to the fourth step.

The details of other embodiments are included in the detailed description and drawings.

According to the present disclosure as described above, as the assembly structure of the heat dissipation fan and the heat sink is changed, the need for separate fastening parts may be eliminated, and production costs may be reduced by simplifying the vertical assembly structure.

According to an embodiment of the present disclosure, as guides for preventing wrong assembly are applied to the base case and the heat sink, the defect rate in the assembly process may be reduced and quality reliability may be secured.

In addition, according to an embodiment of the present disclosure, as the assembly structure of the PCB assemblies and the middle base is changed, assemblability may be enhanced and production costs may be reduced.

In addition, according to an embodiment of the present disclosure, as the assembly operation is performed in a vertical fastening manner, the assembly process may be automated, and the quality of a final product is expected to be enhanced through improvement of quality in the assembly steps.

It will be appreciated that embodiments of the technical idea of the present disclosure can provide various effects which are not specifically mentioned.

DETAILED DESCRIPTION

In order to fully understand the structure and effects of the present disclosure, preferred embodiments of the present disclosure will be described with reference to the accompanying drawings. However, the present disclosure is not limited to the embodiments described below, but may be embodied in various forms and various changes may be made therein. The exemplary embodiments are intended to provide a complete disclosure of the present invention and to provide a person skilled in the art with a complete disclosure of the scope of the present invention. In the accompanying drawings, the constituent elements are enlarged in size for convenience of explanation, and the proportions of the constituent elements may be exaggerated or minimized.

It will be also understood that when an element is described as being "on" or "contacting" another element, it can be directly connected to or contacting the other element or "intervening" elements may be present. On the other hand, if an element is described as being "directly on" or "directly contacting" another element, this can be understood as meaning that there is no other element between the elements. Other expressions that describe the relationship between elements, for example, "between" and "directly between" can be similarly interpreted.

Terms including ordinal numbers such as first, second, etc. may be used to explain various components, but the components are not limited thereto. These terms are used only for the purpose of distinguishing one component from another. For example, a "'first component" may be referred to as a "second component", and similarly, a "second component" may also be referred to as a "first component" without departing from the scope of the present disclosure.

The singular forms "a", "an", and "the" include plural referents unless the context clearly dictates otherwise. In this specification, a term "include" or "have" is intended to indicate that characteristics, figures, steps, operations, constituents, and components disclosed in the specification or combinations thereof exist and can be interpreted as meaning that one or more other characteristics, figures, steps, operations, constituents, components, or combinations thereof can be added.

The terms used in the embodiments of the present disclosure may be construed as having meanings commonly known to those skilled in the art unless otherwise defined.

Hereinafter, preferred embodiments of the present disclosure will be described in detail with reference to the accompanying drawings.

Figure 1:
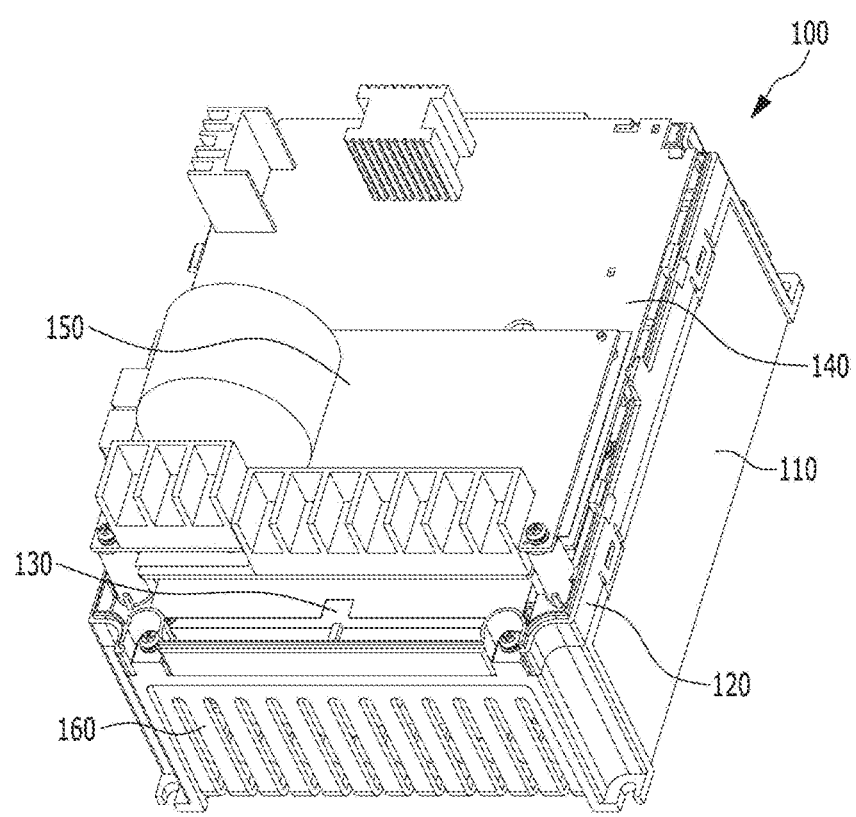
FIG. 1 is a general view of the internal structure of a conventional motor drive unit.
Figure 2:
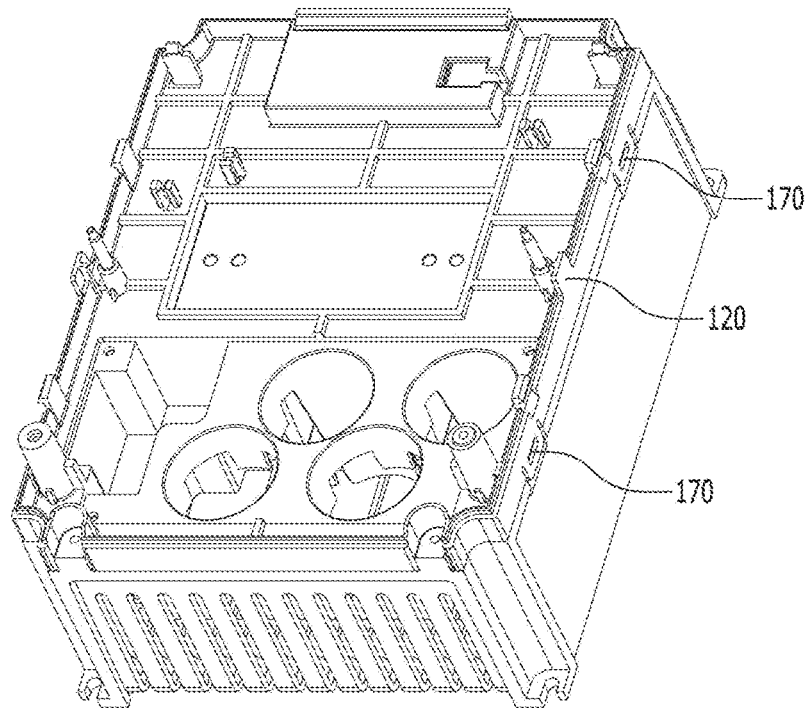
FIG. 2 is an assembly view of a conventional middle base.
Figure 3:
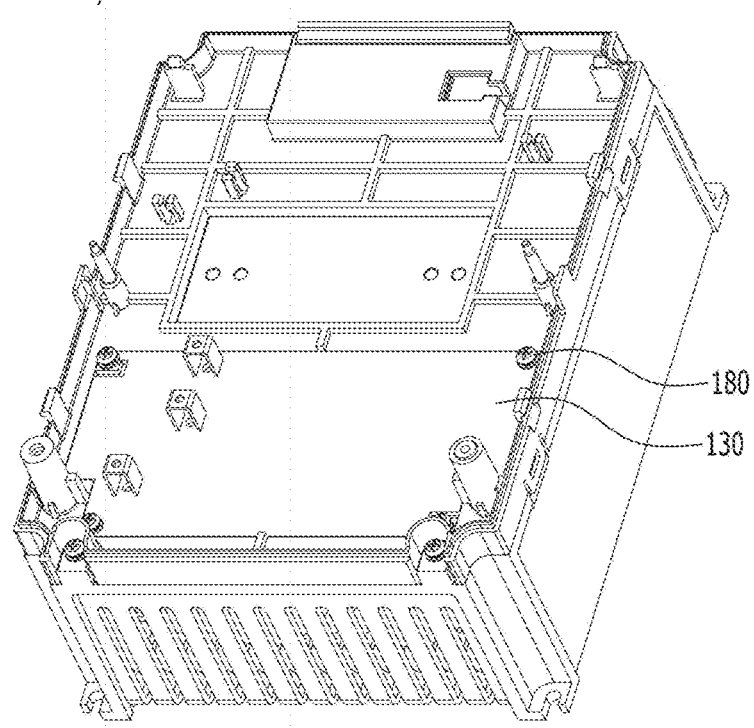
FIG. 3 is an assembly view of a conventional capacitor printed circuit board (PCB) assembly.
Figure 4:
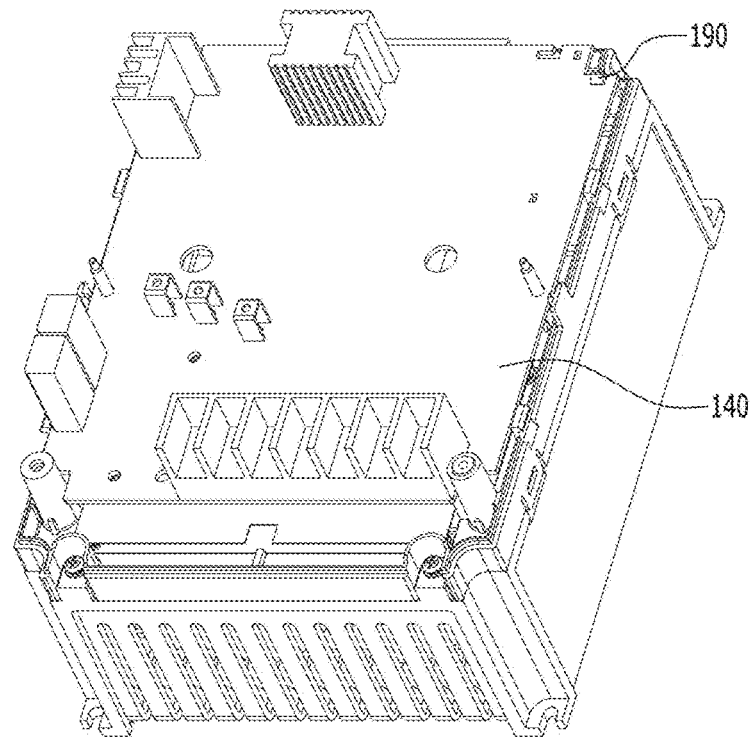
FIG. 4 is an assembly view of a conventional power PCB assembly.
Figure 5:
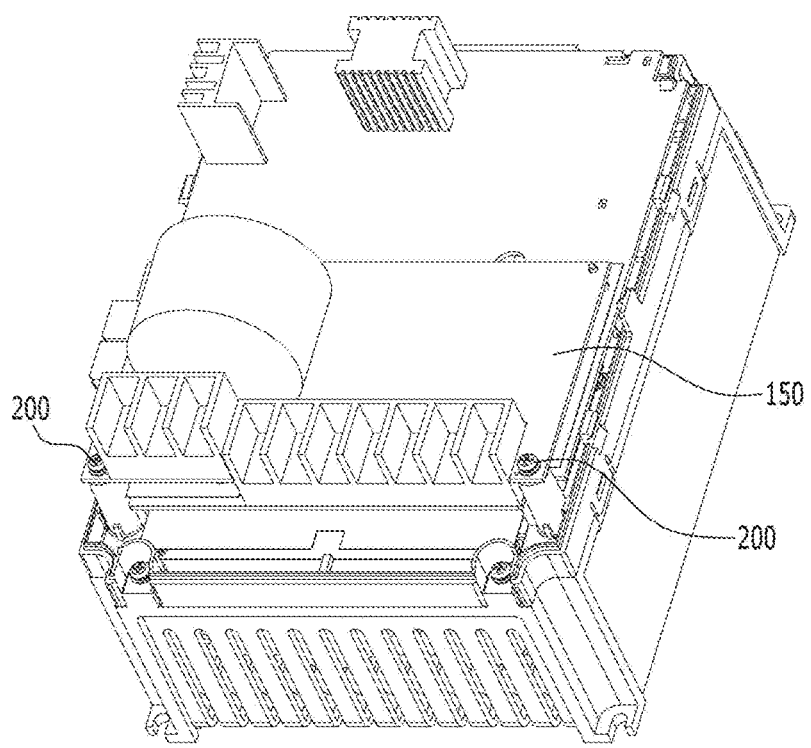
FIG. 5 is an assembly view of a conventional electromagnetic compatibility (EMC) filter PCB assembly.
Figure 6:
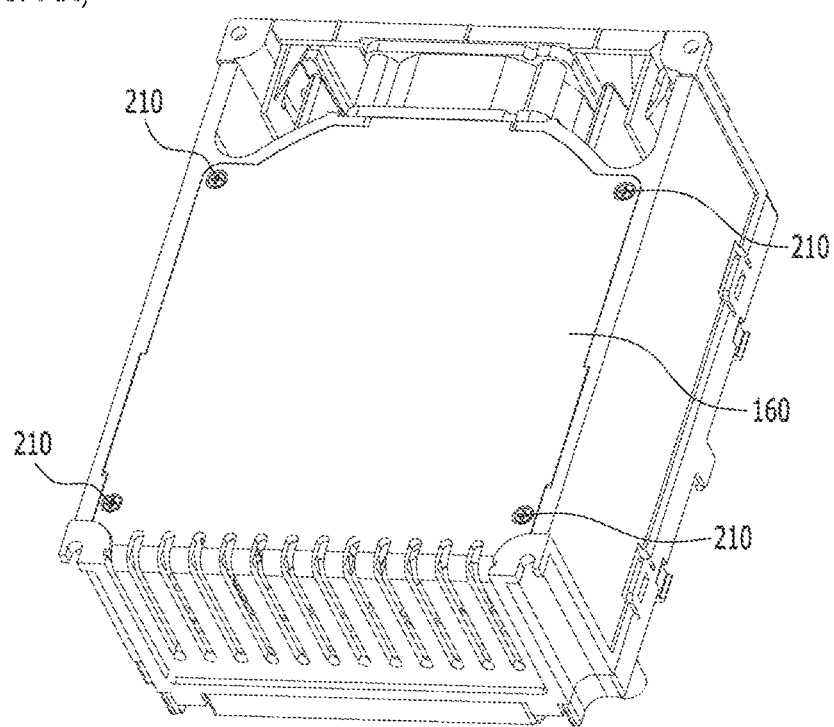
FIG. 6 is an assembly view of a conventional under-cover.
Figure 7:
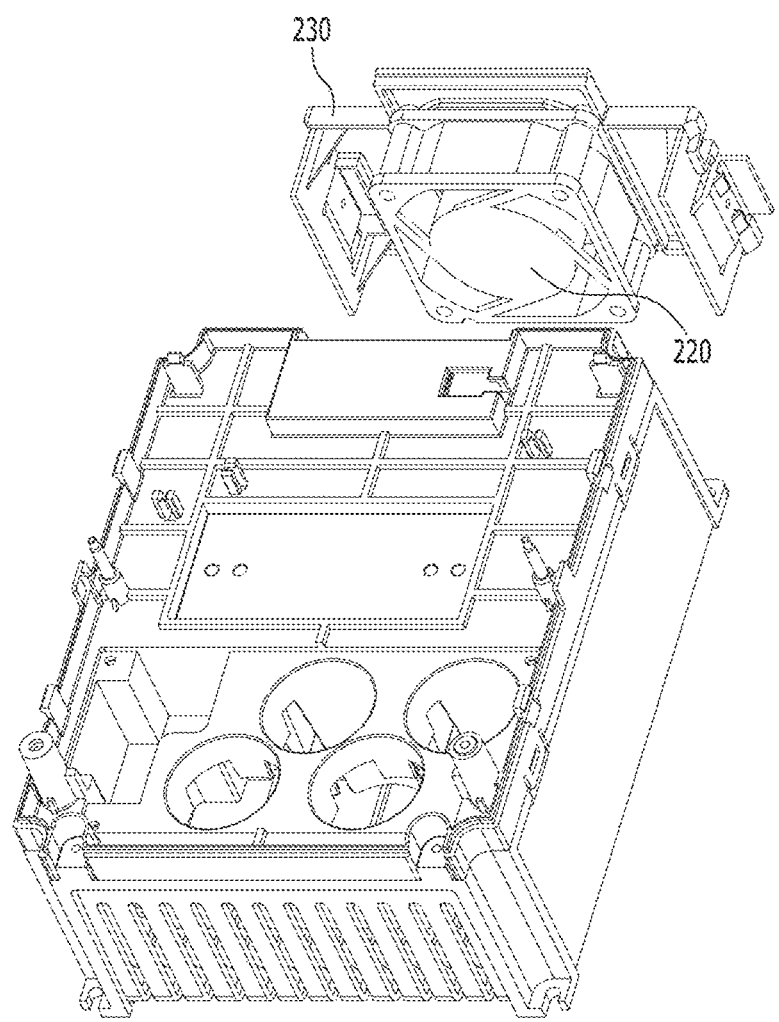
FIG. 7 is a view of a conventional fan.
Figure 8:
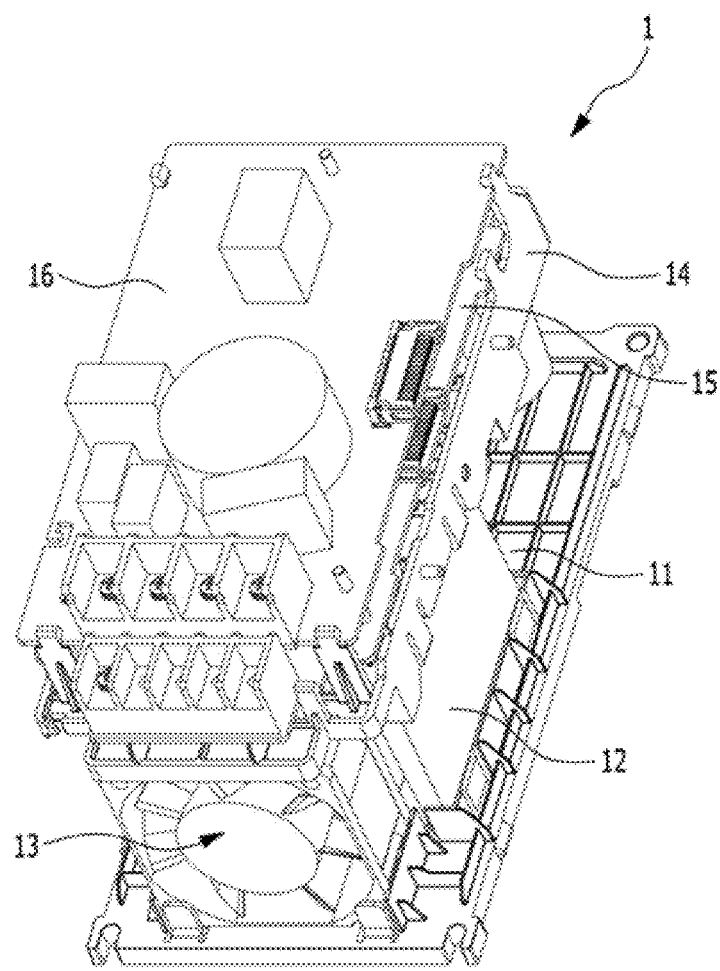
FIG. 8 is an overall structural view of a motor drive unit according to an embodiment of the present disclosure.

FIG. 8 is an overall structural view of a motor drive unit according to an embodiment of the present disclosure.

As shown in FIG. 8, a motor drive unit 1 according to an embodiment of the present disclosure may be configured such that a heat sink 12 is disposed between a base case 11 and a middle base 14, and a heat dissipation fan 13 is connected to a front surface of the heat sink 12, a power printed circuit board (PCB) assembly 15 is connected to an upper portion of the middle base 14 and a filter PCB assembly 16 is disposed over the power PCB assembly 15.

The motor drive unit according to the embodiment of the present disclosure may improve product quality by improving the assembly structure without using assembling parts such as screws. Hereinafter, the present disclosure will be described in more detail with reference to the drawings.

Figure 9A:
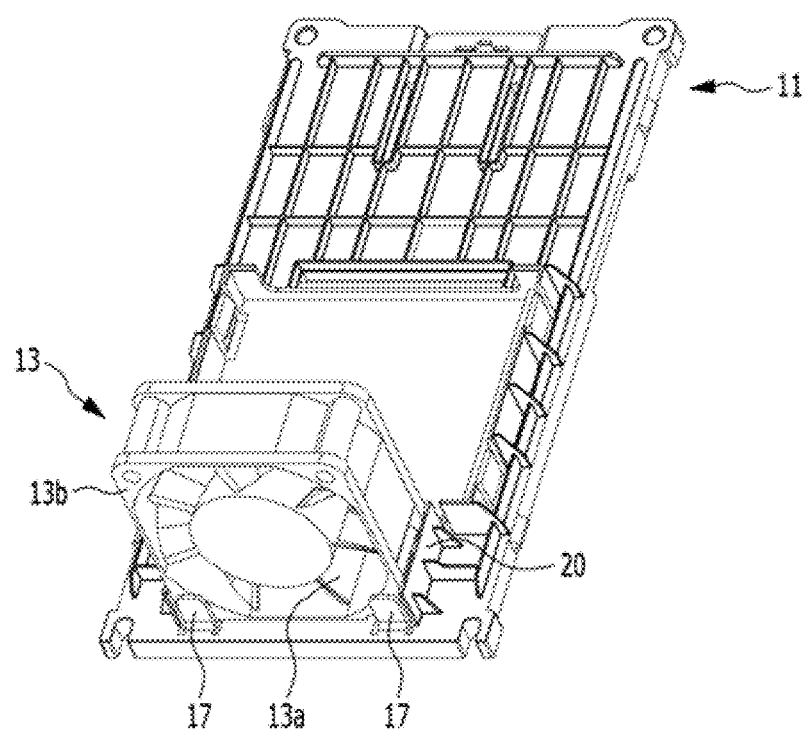
FIG. 9A is an assembly view of a heat dissipation fan according to an embodiment of the present disclosure.
Figure 9B:
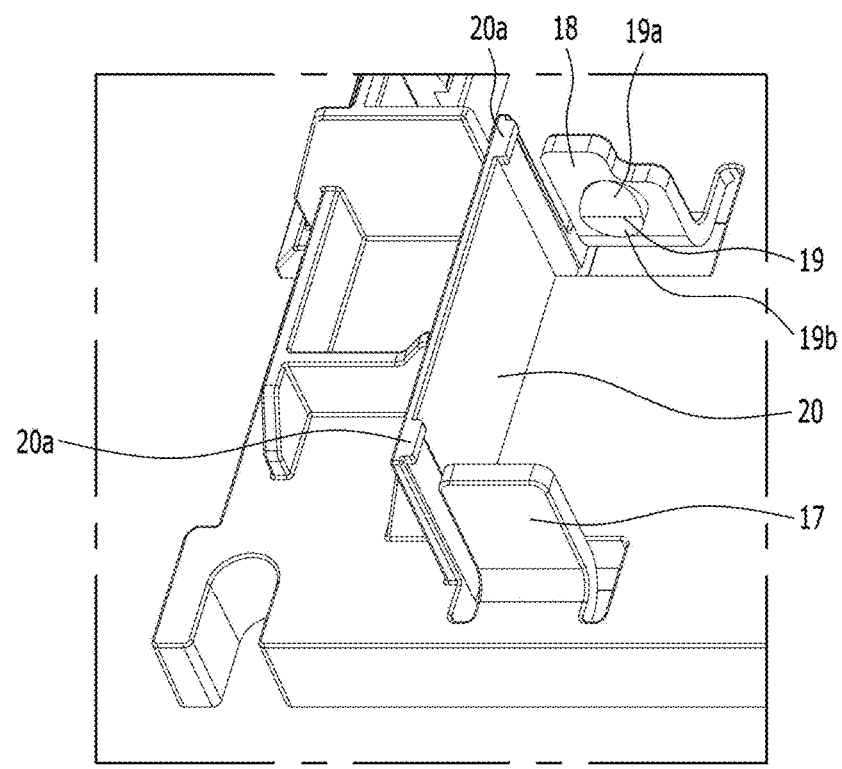
FIG. 9B is a view specifically illustrating the assembly structure of a heat dissipation fan according to the embodiment of the present disclosure.

FIG. 9A is an assembly view of a heat dissipation fan according to an embodiment of the present disclosure, and FIG. 9B is a view specifically illustrating the assembly structure of a heat dissipation fan according to the embodiment of the present disclosure.

As shown in FIGS. 9A and 9B, in the assembly structure according to an embodiment of the present disclosure, the heat dissipation fan 13 may include a fan 13a and a fan housing 13b arranged outside the fan 13a to fix the fan 13a.

The base case 11 may be provided with hook fixing portions 17 and hook supports 18, which are disposed to correspond to the positions where the front face portion and rear face portion of the fan housing 13b are placed. A hook engagement portion 19 may be provided on the inner surface of each of the hook fixing portions 17 and the hook supports 18, and a hole corresponding to the hook engagement portion 19 may be formed in each of the front face portion and rear face portion of the fan housing 13b. Although not shown in the structure of the figures, the same hook engagement portion 19 as provided to the hook supports 18 may be provided on the inner surface of the hook fixing portion 17.

The hook engagement portion 19 may be formed such that an upper portion 19a thereof is inclined outward from the inner surface of the hook fixing portion 17 or the hook support 18 to allow the fan housing 13b to be lowered from above and connected to the base case 11. A lower portion 19b of the hook engagement portion 19 may extend from the boundary between the upper portion 19a and the lower portion 19b and be arranged in parallel with the inner surface of the hook fixing portion 17 or the hook support 18.

While the hook engagement portion 19 is illustrated as having a circular shape, embodiments of the present disclosure are not limited thereto. The hook engagement portion 19 may be configured in various shapes. The holes provided in the front face portion and rear face portion of the fan housing 13b may be formed according to the shape of the hook engagement portion 19.

In addition, fan guide portions 20 may be disposed to correspond to the positions where the left side face portion and the right side face portion of the fan housing 13b are placed. Projections 20a may be formed on the upper surface of the fan guide portion 20 to fix the front face portion and rear face portion of the fan housing 13b are. That is, the outer surface of the front face portion of the fan housing 13b and the side surface of the projections 20a may contact each other to fix the fan housing 13b.

In installing the heat dissipation fan 13, the heat dissipation fan 13 may be fixed to the base case 11 in a manner that the heat dissipation fan 13 is lowered from above toward the base case 11, and the hook engagement portions 19 are fitted into the holes of the fan housing 13b. The heat dissipation fan 13 may be disposed inside the fan guide portions 20 such that the front face portion and rear face portion of the heat dissipation fan 13 are fixed by the projections 20a on the left side face portion and right side face portion of the fan housing 13b. Thereby, movement of the heat dissipation fan 13 may be restricted in all directions.

Figure 10A:
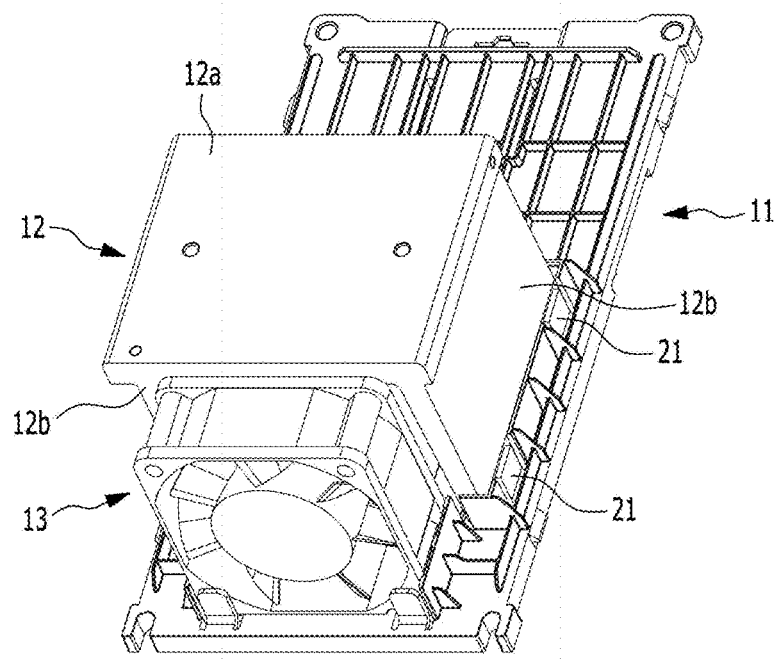
FIG. 10A is an assembly view of a heat sink according to an embodiment of the present disclosure.
Figure 10B:
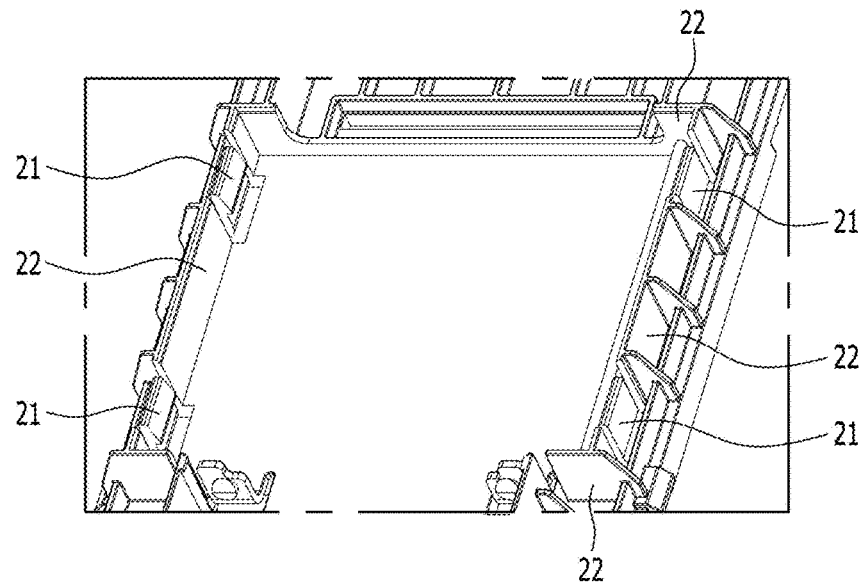
FIG. 10B is a view specifically illustrating the structure of a base case in which the heat sink according to the embodiment of the present disclosure is installed.
Figure 10C:
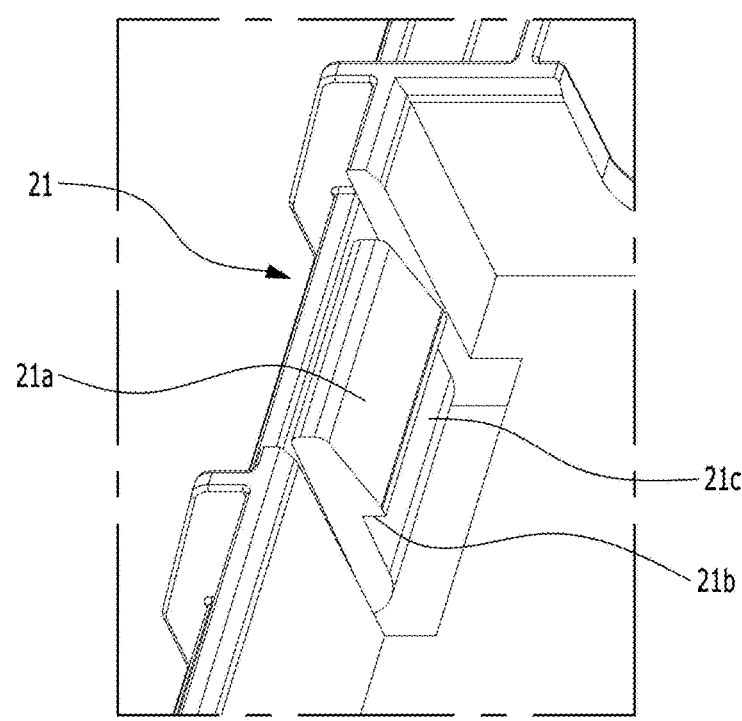
FIG. 10C is a detailed view of a hook portion according to an embodiment of the present disclosure.
Figure 10D:
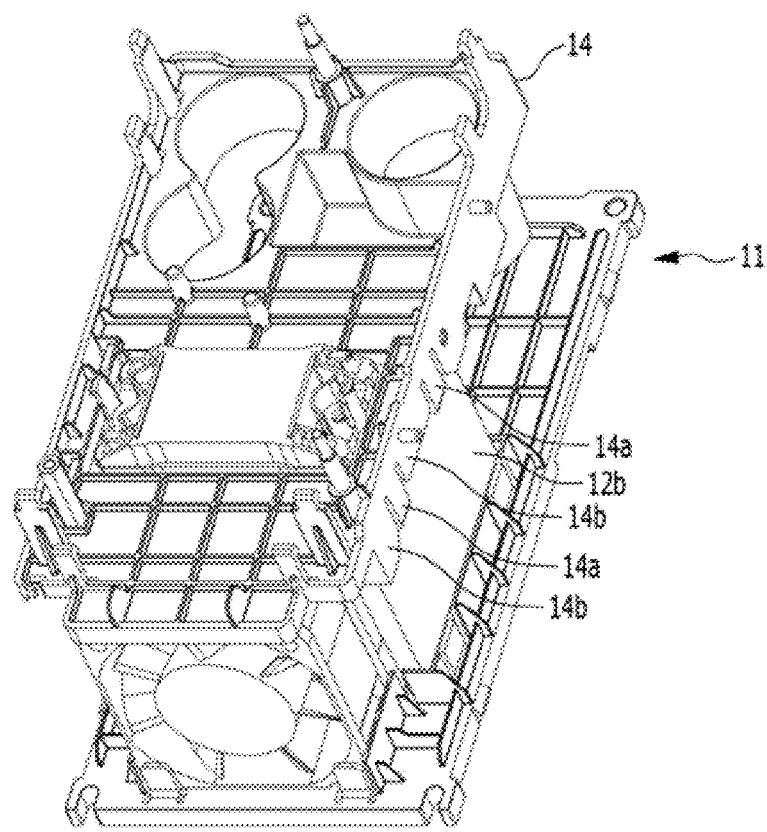
FIG. 10D is an exemplary view specifically illustrating the assembly structure of a heat sink and a middle base according to an embodiment of the present disclosure.
Figure 10E:
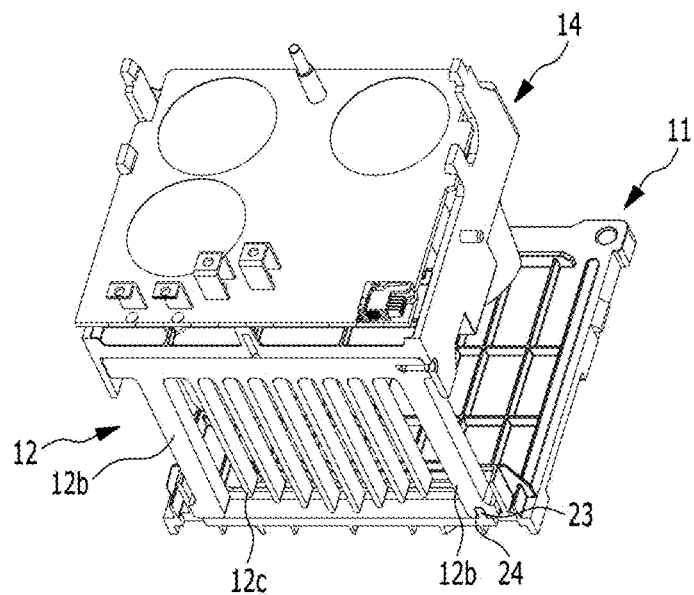
FIGS. 10E and 10F are views illustrating the assembly structure of a front surface of a heat sink according to an embodiment of the present disclosure.
Figure 10F:
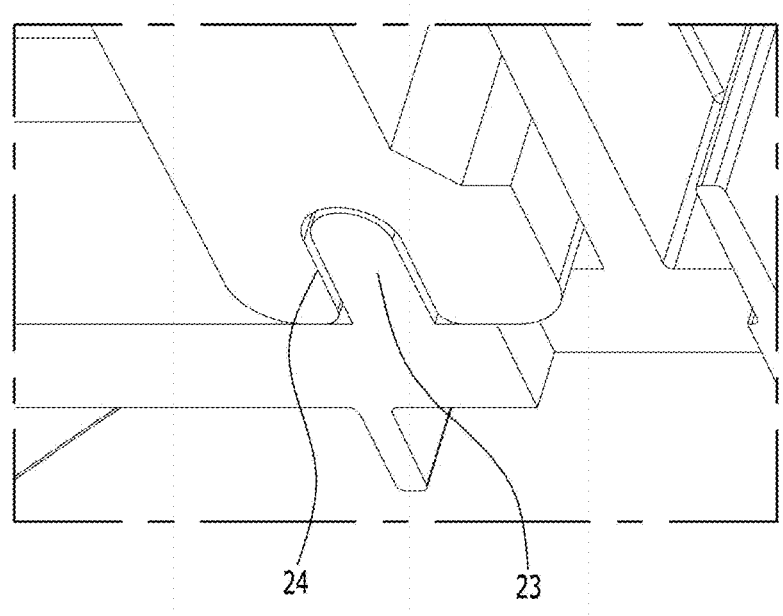

FIG. 10A is an assembly view of a heat sink according to an embodiment of the present disclosure, and FIG. 10B is a view specifically illustrating the structure of a base case in which a heat sink according to an embodiment of the present disclosure is installed. FIG. 10C is a detailed view of a hook portion according to an embodiment of the present disclosure, and FIG. 10D is an exemplary view specifically illustrating the assembly structure of a heat sink and a middle base according to an embodiment of the present disclosure. FIGS. 10E and 10F are views illustrating the assembly structure of a front surface of a heat sink according to an embodiment of the present disclosure.

As shown in the figures, the heat sink 12 may include a base 12a on which a heat dissipation element is disposed and side face portions 12b extending vertically downward from both left and right ends of the base 12a. A plurality of heat dissipation fins 12c vertically protruding from the base 12a may be disposed inside the side face portions 12b of the heat sink 12. The heat dissipation fins 12c may have the same length as that of the side face portions 12b.

The front face portion of the heat sink 12 may be disposed on the base case 11 so as to contact the rear face portion of the fan case 13b of the heat dissipation fan 13. In the base case 11, the hook portions 21 may be disposed to correspond to the positions at which the side face portions 12b of the heat sink 12 are disposed, and the heat sink guide portions 22 may be arranged along the outer peripheral surface of the heat sink 12 except the positions where the hook portions 21 are disposed.

The hook portion 21 may include an upper portion 21a inclined toward the heat sink 12 and a lower portion 21c formed under the upper portion 21a and arranged in parallel with the side face portions 12b of the heat sink 12. A step 21b may be formed in an area where the upper portion 21a meets the lower portion 21c.

Although it is illustrated that four hook portions 21 are disposed on the front side and the rear side of the side face portions 12b of the heat sink 12, the present disclosure is not limited thereto. Fewer or more hook portions may be disposed.

Once the heat sink 12 is installed in the inner space where the hook portions 21 and the heat sink guide portions 22 are disposed, movement thereof in the installation direction (vertical direction) is restricted by the hook portions 21, and the movement thereof in the up-and-down direction and the left-right direction may be restricted by the heat sink guide portions 22.

The middle base 14 is disposed on the upper portion of the base 12a of the heat sink 12. The lower surface of the middle base 14 may be provided with hook portions 14a and heat sink guide portions 14b which are arranged to correspond to the hook portions 21 and the heat sink guide portions 22 of the base case 11. Thereby, movement of the heat sink 12 on the middle base 14 may be restricted in all directions.

FIG. 10E shows the heat sink 12. Although the side face portions 12b and the front portion of the heat dissipation fins 12c are omitted from the figure for simplicity, it should be noted that the assembly operation is performed with the side face portions 12b and the front portion of the heat dissipation fins 12c present.

As shown in the figure, ribs 23 for preventing wrong assembly may vertically protrude from the base case 11 corresponding to the bottom surface of one of the side face portions 12b of the heat sink 12. Correspondingly, a recess 24 for preventing wrong assembly may be formed on the lower surface of the heat sink side face portion 12b. That is, as the ribs 23 are formed in the base case 11, and the recess 24 corresponding to the shape of the ribs 23 is formed, wrong assembly may be prevented and movement of the heat sink 12 may be restricted when the heat sink 12 is installed in the base case 11.

While the recess 24 is illustrated as being formed on the right side face portion 12b of the heat sink 12 in the embodiment of the present disclosure, the present disclosure is not limited thereto. The recess 24 may be formed on the left side face portion or on both side face portions.

Further, the ribs 23 may be elongated up to the front surface of the side face portion 12b of the heat sink 12 or only up to the middle of the distance to the front surface, and the length thereof may be determined according to the designer's intention.

Figure 11A:
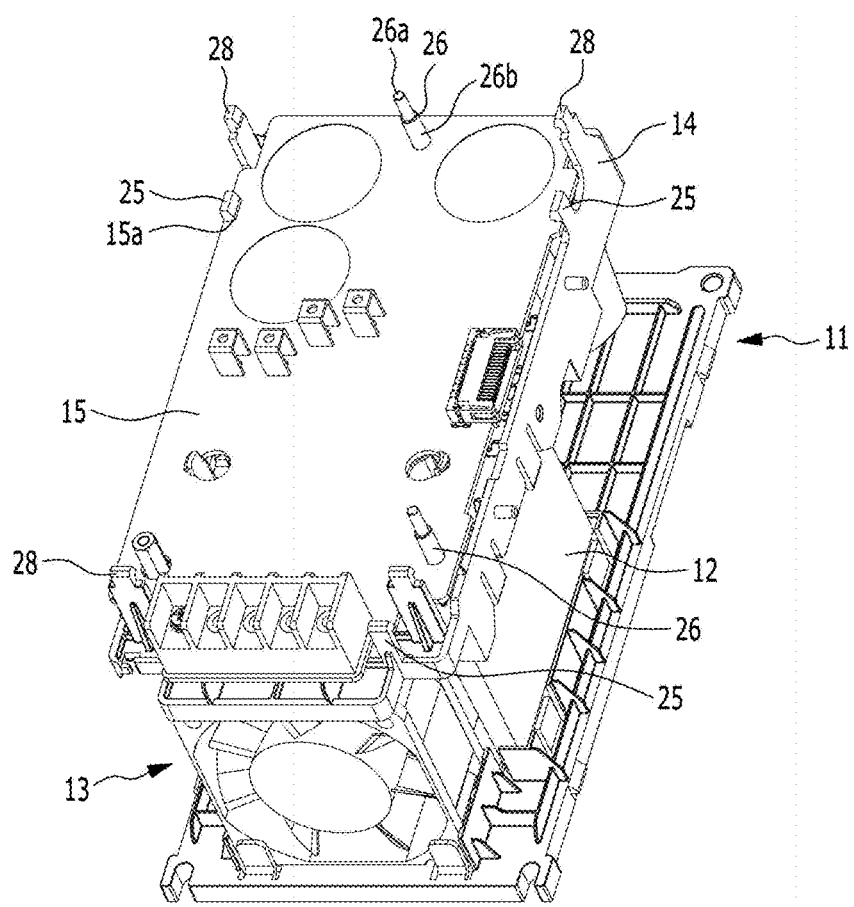
FIG. 11A is an assembly view of a power PCB assembly according to an embodiment of the present disclosure.
Figure 11B:
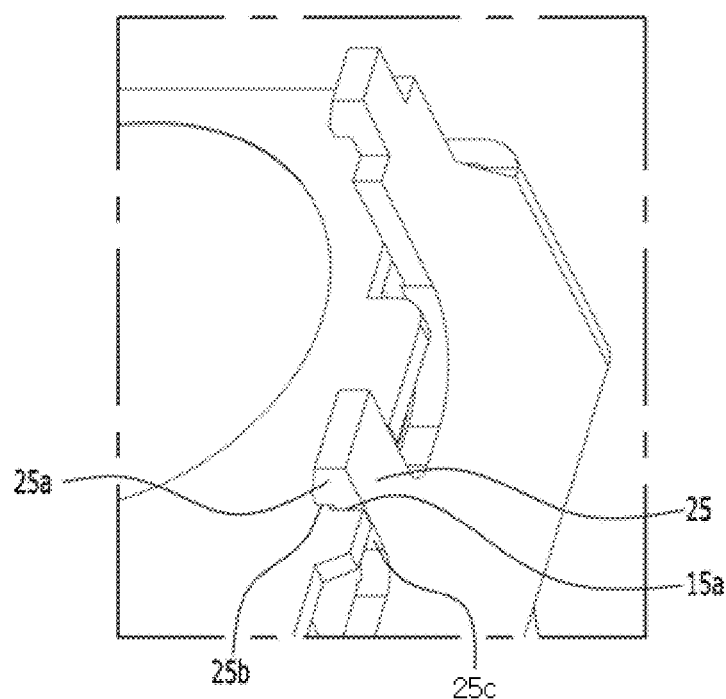
FIG. 11B is an exemplary view specifically illustrating the assembly structure of the power PCB assembly according to the embodiment of the present disclosure.

FIG. 11A is an assembly view of a power PCB assembly according to an embodiment of the present disclosure, and FIG. 11B is an exemplary view specifically illustrating the assembly structure of the power PCB assembly according to the embodiment of the present disclosure.

As shown in FIGS. 11A and 11B, in an embodiment of the present disclosure, a power PCB assembly 15 having a power device disposed therein may be disposed on the upper portion of the middle base 14, and may be vertically coupled to the middle base 14 by the hook portions 25 formed on the side surface of the middle base 14 and be vertically fitted onto bosses 26 for fixing the position of the middle base 14.

The hook portion 25 may include an upper portion 25a having an inner surface extending downward to be inclined inward and a lower portion 25c vertically arranged under the upper portion 25a, and a step 25b may be formed at the boundary between the upper portion 25a and the lower portion. Correspondingly, fastening grooves 15a may be formed on the side portion of the power PCB assembly 15 such that the inner sides of the fastening grooves 15a can be coupled with the steps 25b to restrict vertical movement with the steps 25b.

At least one boss 26 may be formed on the upper surface of the middle base 14. At least one hole to be coupled with the boss may be formed in the power PCB assembly 15. Thereby, movement of the power PCB assembly 15 in the up-and-down direction and the left-right direction may be restricted.

The boss 26 may include an upper portion 26a and a lower portion 26b, wherein the diameter of the cross section of the upper portion 26a may be less than the diameter of the cross section of the lower portion 26b. The power PCB assembly 15 of the present disclosure may have a hole corresponding to the lower portion 26b of the boss 26. However, this is merely illustrative and the cross sections of the upper portion 25a and the lower portion 26b may have the same diameter.

While it is illustrated in one embodiment of the present disclosure that three hook portions 25 and two bosses 26 are formed, embodiments of the present disclosure are not limited thereto. The number of the hook portions 25 and the number of the bosses 26 may vary.

Figure 12A:
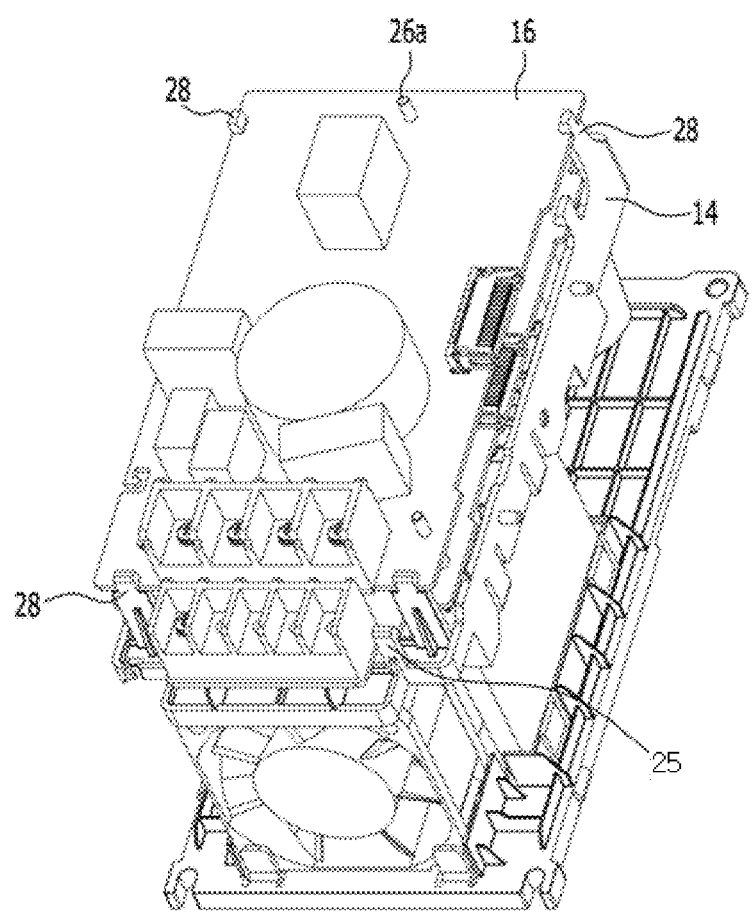
FIG. 12A is an assembly view of a filter PCB assembly according to an embodiment of the present disclosure.
Figure 12B:
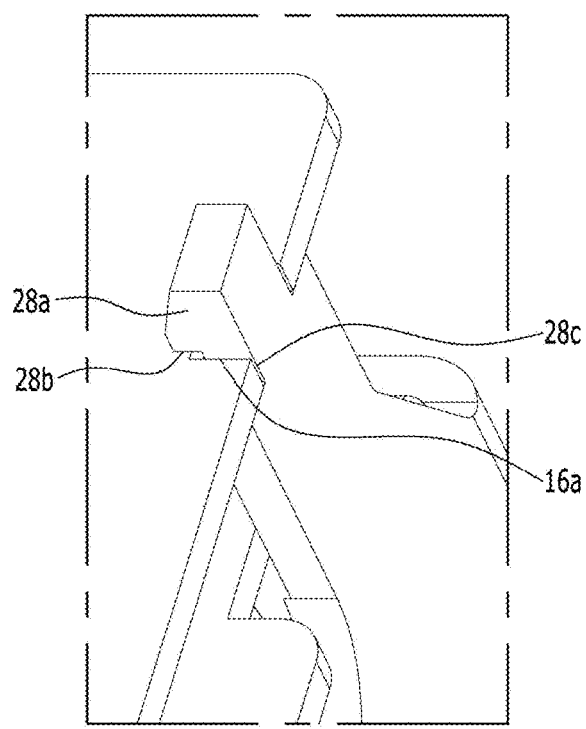
FIG. 12B is an exemplary view specifically illustrating the assembly structure of the filter PCB assembly according to the embodiment of the present disclosure.

FIG. 12A is an assembly view of a filter PCB assembly according to an embodiment of the present disclosure, and FIG. 12B is an exemplary view specifically illustrating the assembly structure of the filter PCB assembly according to the embodiment of the present disclosure.

As shown in FIGS. 12A and 12B, in one embodiment of the present disclosure, the filter PCB assembly 16 may be disposed over the power PCB assembly 15 and vertically fastened by hook portions 28 formed on one side of the middle base 14 and may be vertically fitted onto the upper portions 26a of the bosses 26 for fixing the position of the middle base 14.

The hook portion 28 may include an upper portion 28a having an inner surface extending downward to be inclined inward and a lower portion 28c vertically arranged under the upper portion 28a, and a step 28b may be formed at the boundary between the upper portion 28a and the lower portion. Correspondingly, fastening grooves 16a may be formed on the side portion of the filter PCB assembly 16 such that the inner sides of the fastening grooves 16*a* can be coupled with the steps 28*b* to restrict vertical movement with the steps 28*b*.

In addition, at least one hole to be coupled with the boss 26 of the middle base 14 may be formed in the filter PCB assembly 16. Thereby, movement of the filter PCB assembly 16 in the up-and-down direction and the left-right direction may be restricted.

The boss 26 may be coupled with the power PCB assembly 15 at the lower portion 26*b* and coupled with the filter PCB assembly 16 at the upper portion 26*a*. Here, the hole formed in the filter PCB assembly 16 may have a size corresponding to the cross section of the upper portion 26*a*, and thus the filter PCB assembly 16 may stay fixed without moving down to the lower portion 26*b*.

The length of the lower portion 28*c* of the hook portion 28 may be greater than the length of the lower portion 25*c* of the hook portion 25.

While it is illustrated in the embodiment of the present disclosure that four hook portions 28 are provided, embodiments of the present disclosure are not limited thereto. A larger number of hook portions 28 may be provided.

According to the present disclosure, the bottom of the base case 11 remains disposed on the workbench during the assembly process, and the product need not be rotated or laid down in the process of installing the base case 11, the heat sink 12 and the middle base 14. Therefore, assemblability may be improved.

Further, since the time for rotating, laying down, or fastening the components is not required in production of products, the ST, which is the time required for production, may be shortened.

In addition, according to the assembly structure of the present disclosure, as the assembly structure of the heat dissipation fan 13 and the heat sink 12 is changed, the need for separate fastening parts may be eliminated, and production costs may be reduced by simplifying the vertical assembly structure.

Further, as guides for preventing wrong assembly are applied to the base case 11 and the heat sink 12, the defect rate in the assembly process may be reduced and quality reliability may be secured.

In addition, as the assembly structure of the PCB assemblies 15, 16 and the middle base 14 is changed, assemblability may be enhanced and production costs may be reduced.

Finally, as the assembly operation is performed in a vertical fastening manner, the assembly process may be automated, and the quality of a final product is expected to be enhanced through improvement of quality in the assembly steps.

While the present disclosure has been described in connection with certain exemplary embodiments, it is to be understood that the disclosure is not limited to the disclosed embodiments, but, on the contrary, is intended to cover various modifications and equivalent arrangements included within the spirit and scope of the appended claims. Accordingly, the true scope of the present disclosure should be determined by the following claims.

What is claimed is:

1. An assembly structure for a motor drive unit for converting an input power into an alternating current (AC) power suitable for driving a motor, including:
   a base case;
   a heat dissipation fan comprising a fan and a fan housing arranged outside the fan to fix the fan, the heat dissipation fan being disposed in an area of an upper portion of the base case;
   a heat sink comprising a base and at least one side face portion formed by extending vertically downward from both left and right ends of the base, the heat sink being disposed on one side of the heat dissipation fan on the base case;
   a middle base disposed on the heat sink;
   a power printed circuit board (PCB) assembly disposed on the middle base; and
   a filter PCB assembly disposed over the power PCB assembly, the assembly structure comprising:
      at least one hook fixing portion disposed on an upper surface of the base case to face a front face portion of the fan housing;
      at least one hook support disposed on the upper surface of the base case to face a rear face portion of the fan housing;
      a first guide portion disposed on the upper surface of the base case to face each of a left side face portion and a right side face portion of the fan housing; and
      a hook engagement portion formed on an inner surface of each of the at least one hook fixing portion and the at least one hook support facing each other across the fan housing,
   wherein a hole fitting with the hook engagement portion is formed in areas facing the hook engagement portion on a front surface and a rear surface of the fan housing,
   wherein at least one first hook portion is disposed on the upper surface of the base case to fix the heat sink at the at least one side face portion of the heat sink,
   wherein a second guide portion is disposed on the upper surface of the base case along the at least one side face portion of the heat sink except for an area where the at least one first hook portion is disposed,
   wherein a rib vertically protruding from an area of the base case is provided facing a lower surface of the at least one side face portion of the heat sink, and
   wherein the lower surface of the at least one side face portion of the heat sink is provided with a recess in which the rib enters.

2. The assembly structure according to claim 1, wherein the hook engagement portion comprises:
   a first upper portion inclined obliquely downward from the inner surface of the at least one hook fixing portion or the inner surface of the at least one hook support; and
   a first lower portion extending from the first upper portion in parallel with the inner surface of the at least one hook fixing portion or the inner surface of the at least one hook support.

3. The assembly structure according to claim 1, wherein an upper portion of the first guide portion is provided with a projection protruding from the upper portion of the first guide portion and fixing the fan housing at the front surface and the rear surface of the fan housing.

4. The assembly structure according to claim 1, wherein the at least one first hook portion comprises:
   a second upper portion having an inner surface inclined inward; and
   a second lower portion formed under the second upper portion and arranged in parallel with the heat sink,
   wherein a first step is formed at a boundary between the second upper portion and the second lower portion.

5. The assembly structure according to claim 1, further comprising:

at least one second hook portion disposed on a lower surface of the middle base to fix the heat sink at the at least one side face portion of the heat sink; and a third guide portion disposed on the lower surface of the middle base along the side face of the heat sink except for an area where the at least one second hook portion is disposed.

6. The assembly structure according to claim 1, further comprising:

at least one third hook portion formed on a side surface of the middle base and vertically coupled with the power PCB assembly, wherein the at least one third hook portion comprises:
a fourth upper portion having an inner surface located on a side facing the power PCB assembly and extending downward to be inclined inward; and
a fourth lower portion vertically arranged at a bottom of the fourth upper portion, wherein a third step is formed at a boundary between the fourth upper portion and the fourth lower portion, wherein the power PCB assembly is provided with a first fastening groove coupling to the at least one third hook portion and an inner side of the first fastening groove is coupled to the third step.

7. The assembly structure according to claim 1, further comprising:

at least one boss on an upper surface of the middle base so as to be coupled with the power PCB assembly and the filter PCB assembly, wherein a hole through which the boss penetrates is formed in each of the power PCB assembly and the filter PCB assembly.

8. The assembly structure according to claim 1, further comprising:

at least one fourth hook portion formed on a side surface of the middle base and vertically coupled to the filter PCB assembly, wherein the at least one fourth hook portion comprises:
a fifth upper portion having an inner surface located on a side facing the filter PCB assembly and extending downward to be inclined inward; and
a fifth lower portion vertically arranged at a bottom of the fifth upper portion, wherein a fourth step formed at a boundary between the fifth upper portion and the fifth lower portion, and wherein a second coupling groove coupling to the at least one fourth hook portion is formed on a side portion of the filter PCB assembly and an inner side of the second coupling groove is coupled to the fourth step.

* * * * *